US012672401B2

(12) United States Patent
Armitage et al.

(10) Patent No.: US 12,672,401 B2
(45) Date of Patent: Jun. 30, 2026

(54) COLOR LEDS WITH INTEGRATED OPTICAL FILTERING ELEMENTS

(71) Applicant: Lumileds LLC, San Jose, CA (US)

(72) Inventors: Robert Armitage, Cupertino, CA (US); Isaac Wildeson, Nashua, NH (US)

(73) Assignee: LUMILEDS SINGAPORE PTE. LTD., Singapore (SG)

( * ) Notice: Subject to any disclaimer, the term of this patent is extended or adjusted under 35 U.S.C. 154(b) by 846 days.

(21) Appl. No.: 17/918,378

(22) PCT Filed: Apr. 16, 2021

(86) PCT No.: PCT/US2021/027611
§ 371 (c)(1),
(2) Date: Oct. 12, 2022

(87) PCT Pub. No.: WO2021/221924
PCT Pub. Date: Nov. 4, 2021

(65) Prior Publication Data
US 2023/0138761 A1     May 4, 2023

Related U.S. Application Data

(60) Provisional application No. 63/018,364, filed on Apr. 30, 2020.

(51) Int. Cl.
*H10H 20/84*          (2025.01)
*H10H 20/811*        (2025.01)
(Continued)

(52) U.S. Cl.
CPC .......... *H10H 20/84* (2025.01); *H10H 20/825* (2025.01); *H10H 20/811* (2025.01); *H10H 20/824* (2025.01)

(58) Field of Classification Search
CPC .... H10H 20/84; H10H 20/825; H10H 20/824; H10H 20/811
See application file for complete search history.

(56) References Cited

U.S. PATENT DOCUMENTS

| | | | |
|---|---|---|---|
| 6,410,942 B1 | 6/2002 | Thibeault et al. | |
| 6,657,236 B1 | 12/2003 | Thibeault et al. | |
| (Continued) | | | |

FOREIGN PATENT DOCUMENTS

| | | |
|---|---|---|
| DE | 102010051286 A1 | 5/2012 |
| DE | 102012109460 A1 | 4/2014 |
| (Continued) | | |

OTHER PUBLICATIONS

Robin, Y. , et al., "What is red? On the chromaticity of orange-red InGaN/GaN based LEDs", Journal of Applied Physics 124, 183102 (2018), 5 pages.

*Primary Examiner* — Mark W Tornow
(74) *Attorney, Agent, or Firm* — Servilla Whitney LLC

(57)          ABSTRACT
A red LED includes a semiconductor LED layer having an active InGaN layer with intrinsic emission spectrum having $L_{Dom}$ in a range of from 580 nm to 620 nm. A filter is positioned over the semiconductor LED layer to filter shorter wavelengths of the intrinsic emission spectrum and shift $L_{Dom}$ by between 5 nm to 20 nm to a longer wavelength.

8 Claims, 10 Drawing Sheets

200A

(51) Int. Cl.
    *H10H 20/824*     (2025.01)
    *H10H 20/825*     (2025.01)

(56)           References Cited

U.S. PATENT DOCUMENTS

| | | | |
|---|---|---|---|
| 6,821,804 B2 | 11/2004 | Thibeault et al. | |
| 8,222,811 B2 | 7/2012 | Vaufrey et al. | |
| 8,258,044 B2 | 9/2012 | Brun et al. | |
| 8,487,340 B2 | 7/2013 | Gilet et al. | |
| 8,638,032 B2 | 1/2014 | Maindron et al. | |
| 8,647,957 B2 | 2/2014 | Borowik et al. | |
| 8,697,548 B2 | 4/2014 | Borowik et al. | |
| 8,698,396 B2 | 4/2014 | Maindron et al. | |
| 8,890,111 B2 | 11/2014 | Templier et al. | |
| 9,093,607 B2 | 7/2015 | Gilet et al. | |
| 9,109,296 B2 | 8/2015 | Metaye et al. | |
| 9,112,112 B2 | 8/2015 | Do et al. | |
| 9,192,290 B2 | 11/2015 | Spinnler et al. | |
| 9,209,366 B2 | 12/2015 | Maindron et al. | |
| 9,263,633 B2 | 2/2016 | Gilet et al. | |
| 9,396,970 B2 | 7/2016 | Gillot et al. | |
| 9,422,628 B2 | 8/2016 | Simonato et al. | |
| 9,496,465 B2 | 11/2016 | Sugimoto et al. | |
| 9,507,204 B2 | 11/2016 | Pelka et al. | |
| 9,601,542 B2 | 3/2017 | Robin et al. | |
| 9,722,160 B2 | 8/2017 | Nakabayashi | |
| 9,768,350 B2 | 9/2017 | Bavencove et al. | |
| 9,780,263 B2 | 10/2017 | Tangring et al. | |
| 9,887,184 B2 | 2/2018 | Takeya et al. | |
| 9,945,526 B2 | 4/2018 | Singer et al. | |
| 9,978,727 B2 | 5/2018 | Takeya et al. | |
| 9,997,688 B2 | 6/2018 | Takeya et al. | |
| 10,002,928 B1 | 6/2018 | Raring et al. | |
| 10,018,325 B2 | 7/2018 | Kim et al. | |
| 10,050,026 B2 | 8/2018 | Takeya et al. | |
| 10,068,884 B2 | 9/2018 | Takeya et al. | |
| 10,145,518 B2 | 12/2018 | Do et al. | |
| 10,964,845 B2 | 3/2021 | Dimitropoulos et al. | |
| 2007/0018102 A1 | 1/2007 | Braune et al. | |
| 2011/0151607 A1 | 6/2011 | Landis et al. | |
| 2011/0287606 A1 | 11/2011 | Brun et al. | |
| 2012/0001204 A1* | 1/2012 | Jagt | H10H 20/8513 359/326 |
| 2012/0205614 A1 | 8/2012 | Templier et al. | |
| 2013/0020115 A1 | 1/2013 | Mataye et al. | |
| 2013/0087821 A1* | 4/2013 | Do | H10H 20/8515 257/98 |
| 2013/0112945 A1 | 5/2013 | Gilet et al. | |
| 2013/0320363 A1 | 12/2013 | Pan et al. | |
| 2014/0077156 A1 | 3/2014 | Bavencove et al. | |
| 2014/0094878 A1 | 4/2014 | Gossler et al. | |
| 2014/0138719 A1 | 5/2014 | Maindron et al. | |
| 2015/0118544 A1 | 4/2015 | Oukassi | |
| 2015/0144590 A1 | 5/2015 | Simonato et al. | |
| 2015/0228873 A1 | 8/2015 | Gebuhr et al. | |
| 2015/0280060 A1 | 10/2015 | Gilet et al. | |
| 2015/0380461 A1 | 12/2015 | Robin et al. | |
| 2016/0079565 A1 | 3/2016 | Maindron et al. | |
| 2016/0099390 A1 | 4/2016 | Tangring et al. | |
| 2016/0190400 A1 | 6/2016 | Jung et al. | |
| 2016/0218240 A1 | 7/2016 | Bouvier et al. | |
| 2016/0293811 A1 | 10/2016 | Hussell et al. | |
| 2017/0080457 A1 | 3/2017 | Eymery et al. | |
| 2017/0098746 A1 | 4/2017 | Bergmann et al. | |
| 2017/0137645 A1 | 5/2017 | Manceau et al. | |
| 2017/0186612 A1 | 6/2017 | Almadori et al. | |
| 2017/0215280 A1 | 7/2017 | Chaji | |
| 2017/0243860 A1 | 8/2017 | Hong et al. | |
| 2017/0293065 A1 | 10/2017 | Kim | |
| 2017/0358563 A1 | 12/2017 | Cho et al. | |
| 2017/0358724 A1 | 12/2017 | Shichijo et al. | |
| 2018/0017939 A1 | 1/2018 | Allier et al. | |
| 2018/0019369 A1 | 1/2018 | Cho et al. | |
| 2018/0019373 A1 | 1/2018 | Lehnhardt et al. | |
| 2018/0061316 A1 | 3/2018 | Shin et al. | |
| 2018/0074372 A1 | 3/2018 | Takeya et al. | |
| 2018/0090540 A1 | 3/2018 | Von Malm et al. | |
| 2018/0138157 A1 | 5/2018 | Im et al. | |
| 2018/0145059 A1 | 5/2018 | Welch et al. | |
| 2018/0149328 A1 | 5/2018 | Cho et al. | |
| 2018/0156406 A1 | 6/2018 | Feil et al. | |
| 2018/0166470 A1 | 6/2018 | Chae | |
| 2018/0174519 A1 | 6/2018 | Kim et al. | |
| 2018/0174931 A1 | 6/2018 | Henley | |
| 2018/0210282 A1 | 7/2018 | Song et al. | |
| 2018/0238511 A1 | 8/2018 | Hartmann et al. | |
| 2018/0248084 A1* | 8/2018 | Peeters | H10H 20/8513 |
| 2018/0259137 A1 | 9/2018 | Lee et al. | |
| 2018/0259570 A1 | 9/2018 | Henley | |
| 2018/0272605 A1 | 9/2018 | Gmeinsieser et al. | |
| 2018/0283642 A1 | 10/2018 | Liao et al. | |
| 2018/0297510 A1 | 10/2018 | Fiederling et al. | |
| 2018/0339643 A1 | 11/2018 | Kim | |
| 2018/0339644 A1 | 11/2018 | Kim | |
| 2018/0354406 A1 | 12/2018 | Park | |
| 2019/0164945 A1 | 5/2019 | Chae et al. | |
| 2019/0386173 A1 | 12/2019 | Chen et al. | |
| 2019/0393379 A1 | 12/2019 | Armitage et al. | |
| 2020/0083407 A1 | 3/2020 | Mck et al. | |
| 2022/0341550 A1* | 10/2022 | Hikmet | H01S 5/0087 |

FOREIGN PATENT DOCUMENTS

| | | | |
|---|---|---|---|
| DE | 102014112551 A1 | 3/2016 | |
| EP | 1378949 A1 | 1/2004 | |
| EP | 2027608 A1 | 2/2009 | |
| EP | 2203939 A1 | 7/2010 | |
| EP | 2211387 A2 | 7/2010 | |
| EP | 2339658 A2 | 6/2011 | |
| EP | 2491591 A1 | 8/2012 | |
| EP | 2499958 A1 | 9/2012 | |
| EP | 2521161 A1 | 11/2012 | |
| EP | 2521162 A1 | 11/2012 | |
| EP | 2553149 A1 | 2/2013 | |
| EP | 2617069 A1 | 7/2013 | |
| EP | 2674516 A1 | 12/2013 | |
| EP | 2855744 B1 | 5/2016 | |
| EP | 3053199 A1 | 8/2016 | |
| EP | 3144272 A1 | 3/2017 | |
| EP | 2006921 B1 | 12/2018 | |
| EP | 3410002 A1 | 12/2018 | |
| EP | 3410003 A1 | 12/2018 | |
| EP | 2710634 B1 | 10/2020 | |
| FR | 2952366 A1 | 5/2011 | |
| FR | 2964796 A1 | 3/2012 | |
| FR | 2969995 A1 | 7/2012 | |
| FR | 2972815 A1 | 9/2012 | |
| FR | 2974940 A1 | 11/2012 | |
| FR | 2974941 A1 | 11/2012 | |
| FR | 2975532 A1 | 11/2012 | |
| FR | 2991342 A1 | 12/2013 | |
| FR | 2991999 A1 | 12/2013 | |
| FR | 2998090 A1 | 5/2014 | |
| FR | 3011383 A1 | 4/2015 | |
| FR | 3041274 A1 | 3/2017 | |
| FR | 3046155 A1 | 6/2017 | |
| FR | 3052915 A1 | 12/2017 | |
| JP | H08250767 A | 9/1996 | |
| JP | 2013247369 A | 12/2013 | |
| JP | 2016532276 A | 9/2014 | |
| JP | 2016066765 A | 4/2016 | |
| KR | 20140118466 A | 10/2014 | |
| KR | 20170018687 A | 2/2017 | |
| KR | 20180010670 A | 1/2018 | |
| KR | 20180057797 A | 5/2018 | |
| KR | 20180114413 A | 10/2018 | |
| TW | 201417339 A | 5/2014 | |
| TW | 201620163 A | 6/2016 | |
| WO | 2006138465 A2 | 12/2006 | |
| WO | 2011045289 A1 | 4/2011 | |
| WO | 2011048318 A1 | 4/2011 | |
| WO | 2012035243 A1 | 3/2012 | |
| WO | 2012156620 A2 | 11/2012 | |
| WO | 2013182969 A1 | 12/2013 | |

(56)                    References Cited

FOREIGN PATENT DOCUMENTS

| WO | 2015044620 A1 | 4/2015 |
| WO | 2016079505 A1 | 5/2016 |
| WO | 2017068029 A1 | 4/2017 |
| WO | 2017102708 A1 | 6/2017 |
| WO | 2017184686 A1 | 10/2017 |
| WO | 2017216445 A1 | 12/2017 |
| WO | 2018091657 A1 | 5/2018 |
| WO | 2018139866 A1 | 8/2018 |
| WO | 2018143682 A1 | 8/2018 |
| WO | 2018159977 A1 | 9/2018 |
| WO | 2018169243 A1 | 9/2018 |
| WO | 2019092357 A1 | 5/2019 |
| WO | 2019126539 A1 | 6/2019 |

* cited by examiner

100

130

120

110

COLOR LEDS WITH INTEGRATED OPTICAL FILTERING ELEMENTS

CROSS-REFERENCE TO RELATED APPLICATIONS

This application is the National Stage entry of PCT/US2021/27611, filed on Apr. 16, 2021, which claims priority to U.S. Provisional Application Ser. No. 63/018,364 filed on Apr. 30, 2020, both of which are incorporated herein by reference in their entireties.

TECHNICAL FIELD

The present disclosure generally relates to manufacture of LEDs with integrated color filter elements. The performance characteristics of a broad-spectrum color LED can be improved by forming a passive optical filtering element directly into the LED structure that can form a part of a microLED array or display system.

BACKGROUND

Semiconductor light-emitting devices (LEDs) can be manufactured to have a wide range of optical emission characteristics. For example, InGaN-based LEDs are capable of emitting light of any color in the visible spectrum, making them attractive for display applications. However, InGaN-based LEDs are distinguished by some unique characteristics, including a tendency for a centroid wavelength of the emission spectrum (Lc) to shift to shorter wavelength as the operating current density increases. This characteristic is due in part to screening of internal electrical fields by injected carriers. A second characteristic is a tendency for the spectrum full-width half maximum (FWHM) to be broad, especially for the longer range of $L_c$. The FWHM may be as broad as 50-70 nm for InGaN spectra in the red range. It should be noted that FWHM of InGaN red LEDs can be so broad that a significant fraction of output power is emitted in the infrared range. This characteristic is due in part to increasing inhomogeneity of InGaN quantum wells (QWs) with higher indium concentrations.

These characteristics of InGaN spectra have viewing implications. The shift of Lc with drive current makes it difficult to control the optical output power and emission color independently of each other. More current is needed to increase the output power, but more current also causes the color to change. For example, the emission of a green LED appears blue-green appearance at higher current, while that of a red LED appears yellow. The broad emission spectrum has additional implications when operating the LED at a fixed current. The human eye is much more sensitive to green and yellow light than to blue and red light. This means a small part of the spectrum of a red or blue LED extending into the yellow-green range has a disproportionately large impact on the color perceived by the eye (dominant wavelength). Although an InGaN LED with $L_c$ of 625 nm emits >90% of its radiometric flux in the red range, its dominant wavelength ($L_{Dom}$) is orange due to a small "tail" of its spectrum extending to shorter wavelength. The broad FWHM and shift of Lc with current density have so far hindered the adoption of red InGaN LEDs in many applications.

Some attempts have been made to provide improved InGaN spectra. For example, U.S. Pat. No. 10,361,341 to Danesh et al.1 disclosed a red InGaN LED spectra measured at low current density (1.2 A/cm²), the least demanding operating condition in view of the (Lc) shift with increasing current density. However, many applications require much higher current density to obtain the required flux.

Improved structures and elements are needed for InGaN LEDs, particularly for LED displays with high color gamut. Such displays may require a peak or dominant wavelength ($L_{Dom}$) as long as 625 nm. In current state of the art an $L_{Dom}$ of 620 nm is barely possible with InGaN at low drive current density and impossible at higher current densities. This limitation prevents manufacture of displays with high color gamut having all three emitters (e.g., RGB) made from the same InGaN materials system. Due to complexity in integrating LEDs from different materials systems into the same display, it is preferable to use InGaN for all three colors rather than incorporating GaAs-based or other LED materials for red pixels in a display.

SUMMARY

In accordance with embodiments of the invention, a red LED includes a semiconductor LED layer having an active InGaN layer with intrinsic emission spectrum having $L_{Dom}$ in a range of from 580 nm to 620 nm. A filter is positioned over the semiconductor LED layer to filter shorter wavelengths of the intrinsic emission spectrum and shift $L_{Dom}$ by between 5 nm to 20 nm to a longer wavelength.

In another embodiment, a blue LED includes a semiconductor LED layer having an active InGaN layer that emits an intrinsic spectrum with dominant wavelength greater than 470 nm and color saturation less than 93%. A filter is positioned over the semiconductor LED layer to filter out longer wavelengths of the emitted intrinsic spectrum and increase color saturation by at least 3 percentage points.

In another embodiment an infrared LED includes a semiconductor LED layer having an active InGaN layer that emits an intrinsic spectrum with centroid WL in a range of from 640 nm to 740 nm. A filter is positioned over the semiconductor LED layer to filter out a shorter wavelength part of the emitted intrinsic spectrum and increase centroid WL by 10 nm to 100 nm.

In another embodiment a green LED includes a semiconductor LED layer having an active InGaN layer that emits an intrinsic spectrum with dominant wavelength less than 535 nm and color saturation less than 90%. A filter is positioned over the semiconductor LED layer to filter out shorter wavelengths of the emitted intrinsic spectrum and increase color saturation by at least 3 percentage points.

In some embodiments, the filter may be positioned over the semiconductor layer and at least one of directly integrated, positioned in contact, or positioned on an intermediate transparent layer with respect to the semiconductor LED layer.

In some embodiments, a transparent conductive layer is attached to the semiconductor LED layer, and the filter is attached to the transparent conductive layer.

In some embodiments, a transparent sapphire layer is attached to the semiconductor LED layer on a first side, and the filter is attached to the transparent sapphire layer on a second side.

In some embodiments, the filter includes absorptive material.

In some embodiments, the filter includes II-VI semiconductors.

In some embodiments, the filter includes at least one metallic material.

In some embodiments, the filter includes a wavelength selective mirror.

In some embodiments, the LED is a microLED.

In some embodiments, the LED forms a part of an RGB display.

BRIEF DESCRIPTION OF THE DRAWINGS

Non-limiting and non-exhaustive embodiments of the present disclosure are described with reference to the following figures, wherein like reference numerals refer to like parts throughout the various figures unless otherwise specified.

DETAILED DESCRIPTION

Figure 1:
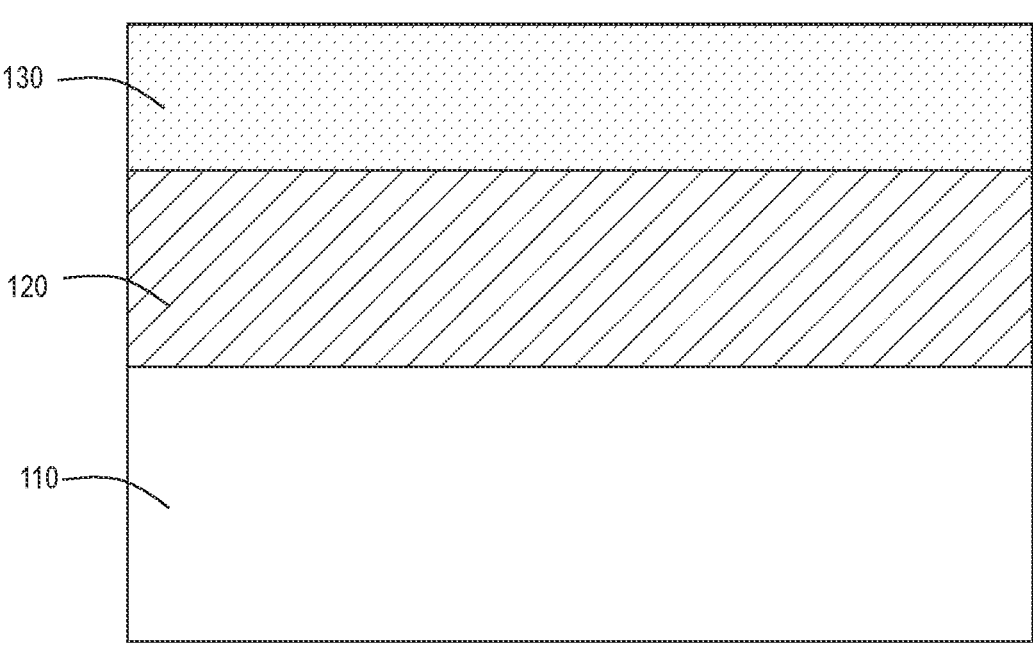
FIG. 1 is a not to scale illustration of a filter directly integrated with a semiconductor layer that includes active light emitting regions.

FIG. 1 is a not to scale illustration of a filter positioned over a semiconductor layer that includes active light emitting regions. In some embodiments, the filter can be an absorptive filter, while in other embodiments a mirror filter can be used. As seen in FIG. 1, a LED 100 includes a substrate 110 supporting a semiconductor LED layer 120 and a filter 130 formed in contact with the semiconductor LED layer 120 to block selected wavelengths of light. At least some light emitted from the semiconductor layer 120 must pass through the filter 130. The filter 130 can be directly integrated with the semiconductor layer 120 (as shown), formed to contact the semiconductor layer, or be positioned on one or more intermediate transparent layers.

The substrate 110 can be formed of patterned or unpatterned sapphire, silicon, or silicon carbide that is able to support an epitaxially grown or deposited semiconductor LED layer 120. In one embodiment, a semiconductor p-layer can be sequentially grown or deposited on an n-layer, forming an active region at the junction between layers. Semiconductor materials capable of forming high-brightness light emitting devices can include, but are not limited to, Group III-V semiconductors, particularly binary, ternary, and quaternary alloys of gallium, aluminum, indium, and nitrogen, also referred to as III-nitride materials. In one embodiment, an n-type GaN layer, a red-emitting InGaN QW active region, and a p-type GaN layer can be grown.

After epitaxial growth of the semiconductor LED layer 120, conventional wafer fabrication processes used for manufacture of thin-film flip chip (TFFC) LED products can be used. After photoelectrochemical surface texturing of a substrate 110 diced to form tiles including one or more LEDs, the tile can be cleaned and then loaded into a RF sputtering deposition chamber. In one embodiment, a filter 130 that absorbs desired wavelengths can include polycrystalline II-VI semiconductor alloy with approximate composition $CdSe_{0.4}S_{0.6}$ and thickness of 800 nm can be deposited over the tile using an alloy target, conformally coating the textured GaN light-emitting surfaces. Typically, the absorptive filter coating has optical transmission greater than 60% for wavelengths longer than 610 nm and close to zero for wavelengths shorter than 600 nm.

Various light absorptive materials in the family of II-VI semiconductors can also be used. Typically, such light absorptive materials have a direct band gap giving high absorption with a sharp cut-off wavelength in the spectral range between green and near-infrared. For example, alternative compositions may include $Cd_{0.2}Zn_{0.8}Te$ which has similar optical properties to $CdSe_{0.4}S_{0.6}$. The thickness of the II-VI semiconductor coating can include a useful range that spans thickness values from 200-2000 nm. The optimum thickness depends on both the material selected and the deposition conditions. These coatings can be fabricated with physical vapor deposition techniques such as sputtering, thermal, or e-beam evaporation. Some materials can also be deposited from wet chemical baths, though bath methods may be less amenable to precise control of composition and optical properties. A small (<0.1%) concentration of an impurity such as Cr or Fe can be added to increase resistivity of the II-VI material and prevent electrically shorting the semiconductor LED layer 120.

In some embodiments, as an alternative to use of absorptive II-VI semiconductor filters, a metallic reflective composition can be used. While Cu is particularly well suited to preferentially reflect the longer-wavelength part of the emission spectrum of an InGaN red LED, any metal with the characteristic of decreasing reflectivity with wavelength shorter than red could be used. Some alternatives include Au, Au—Cu alloys, and conducting metal nitride compounds such as TiN, HfN, ZrN, CrN and/or mixtures therefor. In one example, Cu can be deposited directly on p-GaN, or can be deposited after deposition of a 2-10 nm thick layer of Ni on p-GaN, since Cu directly on p-GaN has less optimal electrical properties. The Ni layer may be annealed in a separate process step prior to Cu deposition.

In another embodiment, a reflective filtering element (i.e., a wavelength selective mirror filter) can be integrated at end of chip or tile processing. After epitaxial growth, wafer fabrication processes used in conventional chip-scale-package LED products can support high-reflectivity thin-film side coatings deposited by atomic layer deposition (ALD). In this embodiment, before the die attach step, ALD is used to deposit a dielectric mirror uniformly and conformally over the outer 5 sides of the chip which are light emitting surfaces. The materials used for the mirror are 6 layers of $TiO_2$ (high index) and 5 layers of $SiO_2$ (low index) deposited in alternating sequence. The optical interference that results from respective thickness values of 50 nm and 80 nm is useful for filtering the emission of an InGaN red LED.

In some applications filtering the emitted light can be only needed for one emitting surface of the LED, rather than 5 surfaces. Some applications may use an array of LEDs packed so closely together that light escaping from a side-wall is blocked by the adjacent LED. The dielectric mirror may be deposited by any of the various physical or chemical vapor deposition techniques, including plasma-assisted techniques, and may use materials from a broad class of dielectric oxides and nitrides. As another example, a mirror design that is effective for filtering an InGaN red LED is comprised of 11 layers of $SiN_x$ and 10 layers of $SiO_2$ with respective thickness of 70 nm and 93 nm. Such dielectric mirror coating can also be applied to suppress the long-wavelength part of the emission of a blue LED, simply by adjusting the thickness of dielectric layers. Transmission characteristics of a coating for filtering blue light involve use of 5 layers of $SiN_x$ and 4 layers of $SiO_2$ of respective thickness 73 and 97 nm. Advantageously, the described reflective filters may have lower optical losses for light in the desired range of wavelengths. Light of desired wavelength which is not absorbed by the reflective filter has another change to escape from the die.

In another embodiment, a reflective filtering element (i.e., a wavelength selective mirror filter) can integrated within the semiconductor LED layer 120. In this embodiment the filter 130 includes a coalescence layer applied to provide a two-dimensional surface for the growth of the epitaxial reflective layer. An alternating sequence of 40 layers of $Al_{0.84}In_{0.16}N$ and GaN with respective thickness of 70 and 65 nm is grown over the coalescence layer. Advantageously, $Al_{0.84}In_{0.16}N$ has a smaller refractive index, is n-type electrically conducting and approximately lattice matched to GaN and is thermally stable with respect to growth of subsequent epitaxial layers needed to complete the LED structure. Reflectivity characteristics of the $Al_{0.84}In_{0.16}N$/GaN dielectric mirror are suitable to suppress the shortwavelength part of the emission of a red InGaN LED. Note that while the compositions of $Al_{0.84}In_{0.16}N$ and GaN have particularly favorable lattice matching and reflectivity characteristics, mirror-based filters could be made from any layer pair with compositions selected from $Al_xIn_yGa_{-x-y}$ N and $Al_aIn_bGa_{1-a-b}$ N that have a differing refractive index.

The advantage of using an $Al_{0.84}In_{0.16}N$/GaN filtering mirror integrated into the epitaxy (as discussed above) is that the epitaxial wafer is a "drop-in replacement" as far as the die fabrication, with no additional post-epitaxy fabricating processing steps needed.

In some embodiments, methods of applying post-growth processing techniques to increase the index contrast between GaN and other epitaxial layers can be used to produce a mirror having a narrower stop band and better angular characteristics. For example, this can be achieved by selective photo-electrochemical oxidation of $Al_{0.84}In_{0.16}N$ (or other Al-containing) layers after the LED mesa etch exposes the edges of those layers. $Al_{0.84}In_{0.16}N$ (and other Al-containing layers) can be oxidized into $Al_2O_3$ of small refractive index for process conditions which leave GaN and InGaN unchanged.

In other embodiments, the sequence of layers grown for the mirror can include highly n-type doped and lightly n-type doped GaN layers. After the LED mesa etch exposes the edges of buried layers, a high degree of porosity can be preferentially introduced into the highly n-type doped layers by post-growth electrochemical treatment. Since porous layers have much lower refractive index than non-porous ones, a mirror with better reflectance characteristics than the as-grown $Al_{0.84}In_{0.16}N$/GaN mirror discussed above can be grown. Advantageously, porous GaN layers may also be n-type electrically conducting, unlike oxidized $Al_{0.84}In_{0.16}N$ layers such as previously discussed. Electrical conductivity of the mirror filter can optionally be provided in vertically injected LEDs but is not required for LEDs using lateral current injection.

Figures 2A, 2B:
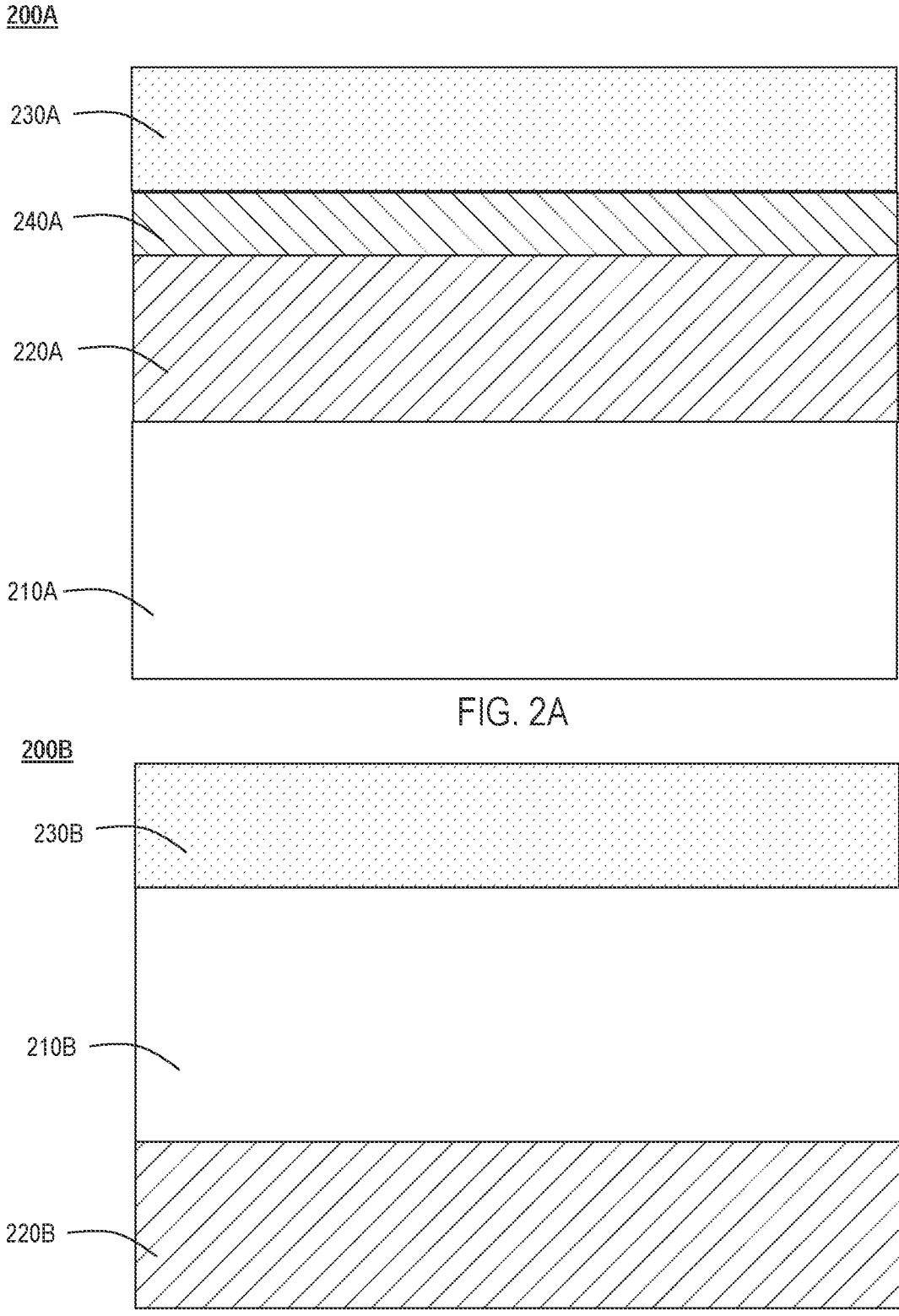
FIG. 2A is a not to scale illustration of a filter formed on a transparent conductive layer formed over a semiconductor layer including active light emitting regions.
FIG. 2B is a not to scale illustration of a filter formed on a transparent substrate over a semiconductor layer including active light emitting regions.

FIG. 2A is a not to scale illustration of a filter positioned over a semiconductor layer that includes active light emitting regions, but in this embodiment directly contacting an intermediate transparent conductive layer that acts as an anode for the underlying semiconductor layer. In some embodiments, the filter can be an absorptive filter, while in other embodiments a mirror filter can be used. As seen in FIG. 2, a LED 200 includes a substrate 210 supporting a semiconductor LED layer 220 and a transparent conductive layer 240. A filter 230 is formed in contact with the transparent conductive layer 240 to suppress selected wavelengths of light. As will be understood, the substrate and semiconductor LED layer can include embodiments such as discussed with respect to FIG. 1.

FIG. 2B is a not to scale illustration of a filter positioned on an intermediate transparent substrate layer over an underlying semiconductor layer that includes active light emitting regions. Similar to the embodiment of FIG. 2A, the filter can be an absorptive filter, while in other embodiments a reflective mirror filter can be used. As seen in FIG. 2B, a LED 200B includes a substrate 210B that can be formed from transparent sapphire or other suitable material that supports growth of a semiconductor LED layer 220B. A filter 230B is formed in contact with the substrate 210B to suppress selected wavelengths of light. The substrate 210B is positioned between the filter 230B and semiconductor LED layer 220B (i.e., the filter is attached on a first side and the semiconductor LED layer is on a second and opposing side)

As will be understood, the substrate and semiconductor LED layer can include embodiments such as discussed with respect to FIG. 1.

In one embodiment, after epitaxial growth of the semiconductor LED layer 220, conventional wafer fabrication processes used for manufacture of thin-film flip chip (TFFC) LED products can be used. An anode contact with the semiconductor LED layer 220 can be formed. In one embodiment, a bilayer of indium-tin oxide (ITO) and Cu can be formed, with the ITO acting as a transparent conductor and the Cu acting as a reflective mirror filter. The ITO and Cu layers can be deposited by a physical vapor deposition technique such as e-beam or thermal evaporation, or sputtering. To improve its characteristics, the ITO layer may be annealed in a separate step before Cu deposition. The ITO thickness is typically in the range 5-50 nm, and the Cu thickness in the range 100-500 nm, with the most preferable values being about 20 nm and about 200 nm, respectively. In some implementations a very thin (1-5 nm) layer of another metal such as Al, Ni, Ti, or Cr can be deposited on top of ITO before Cu to improve its adhesion to ITO.

While implementations with ITO have the best electrical and optical characteristics, in some embodiments ITO can be replaced with a transparent conducting oxide such as ZnO, indium-zinc oxide (IZO), conductive graphene, or other composition able to make an ohmic electrical contact to p-GaN.

In another embodiment, a reflective filtering element (i.e., mirror filter) can be deposited over an anode contact provided by a transparent conductive ITO or other layer. For example, a dielectric mirror can be deposited over the ITO and an array of vias etched through the dielectric mirror to allow contact with the ITO. Ag metal can be deposited over the dielectric mirror with vias making possible electrical contact of Ag to ITO. The dielectric mirror in this example can be designed to have poor reflectivity for the wavelengths to be suppressed and high reflectivity for the wavelengths to be preserved. The first layer of the mirror can be a thick (500 nm) layer of $SiO_2$, followed by 5 alternating layers of $TiO_2$ and 4 layers of $SiO_2$ with respective thickness 40 and 68 nm. Advantageously, this type of composite mirror has 1) filtering capability is not limited by properties of available metals and 2) optical loss in range of wavelengths to be preserved that can be extremely low.

In another embodiment, a composite mirror can be made from a metal coating on top of a stack of alternating ITO layers with different physical density (and hence different refractive indices). ITO layers of different void densities can be deposited using, for example, a deposition chamber with two ITO evaporation sources placed at different angles relative to the substrate wafer. The advantage of this method is that the mirror is comprised entirely of electrically conducting materials and patterning vias is not required, simplifying processing.

The described structures and processes can be used to provide filtering over selected bandwidths and with various performance characteristics depending on particular selections of materials, layer thickness, and number and ordering of layers. In general, red and green LEDs benefit from filters that block shorter wavelengths, while blue LEDs benefit from filters that block longer wavelengths. In effect, a red LED benefits by shifting the dominant wavelength to a desired longer wavelength setpoint. Even considering red light losses in the filter, this approach gives higher external quantum efficiency (EQE) than could be achieved by designing LED to emit true red $L_{Dom}$ without a filter. Alternatively, a broad-spectrum direct blue LED benefits because luminance is maximized with a longer wavelength target while maintaining an acceptable color saturation since that portion of the spectrum that "tails" into the green range is blocked. On the other hand, a green LED may benefit from an increase in color saturation that results from filtering out the shorter wavelength part of its spectrum, especially in applications where it is desired to keep high color saturation over a wide range of operating currents. Although the discussion has focused on visible-light LEDs, it should be noted that a long-pass filter could be applied to an InGaN red LED effectively converting it into an infrared LED. Some selected examples of red and blue filtering using various types of absorptive and mirrored filters are illustrated with respect to the following FIGS. 3A through 8B.

Figure 3A:
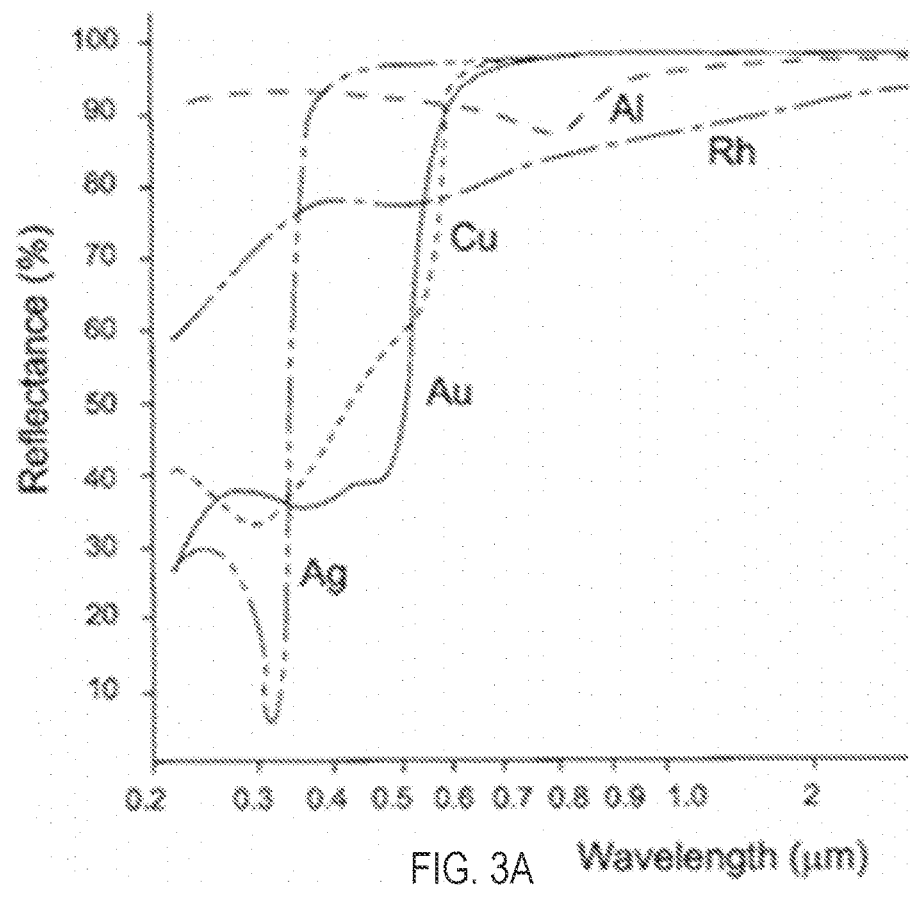
FIG. 3A illustrates a graph of optical reflectivity versus wavelength for selected metals.

FIG. 3A is a graph that illustrates optical reflectivity versus wavelength for selected metals. As is apparent from the graph, among the elements, Cu is particularly suited to enhance reflection of red light relative to shorter wavelengths.

Figure 3B:
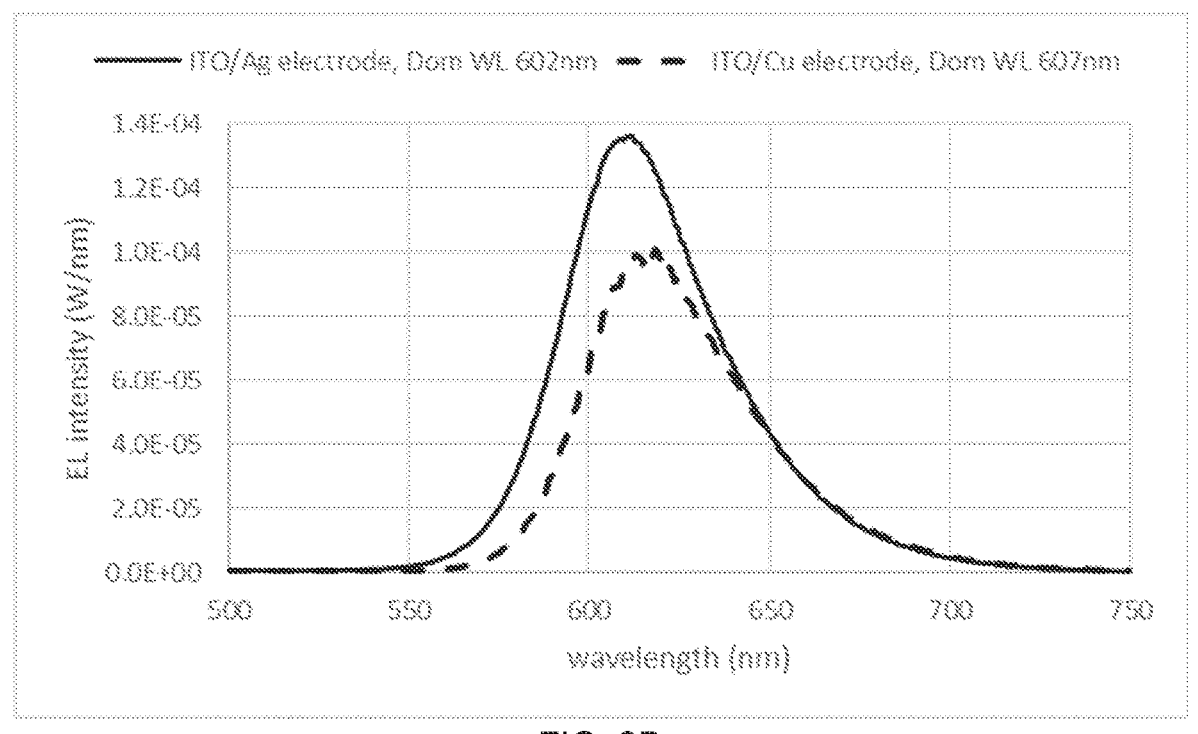
FIG. 3B illustrates a graph of electro-luminescence (EL) intensity versus wavelength for LEDs with a non-filtering ITO/Ag electrode and a filtering ITO/Cu electrode.
Figure 4A:
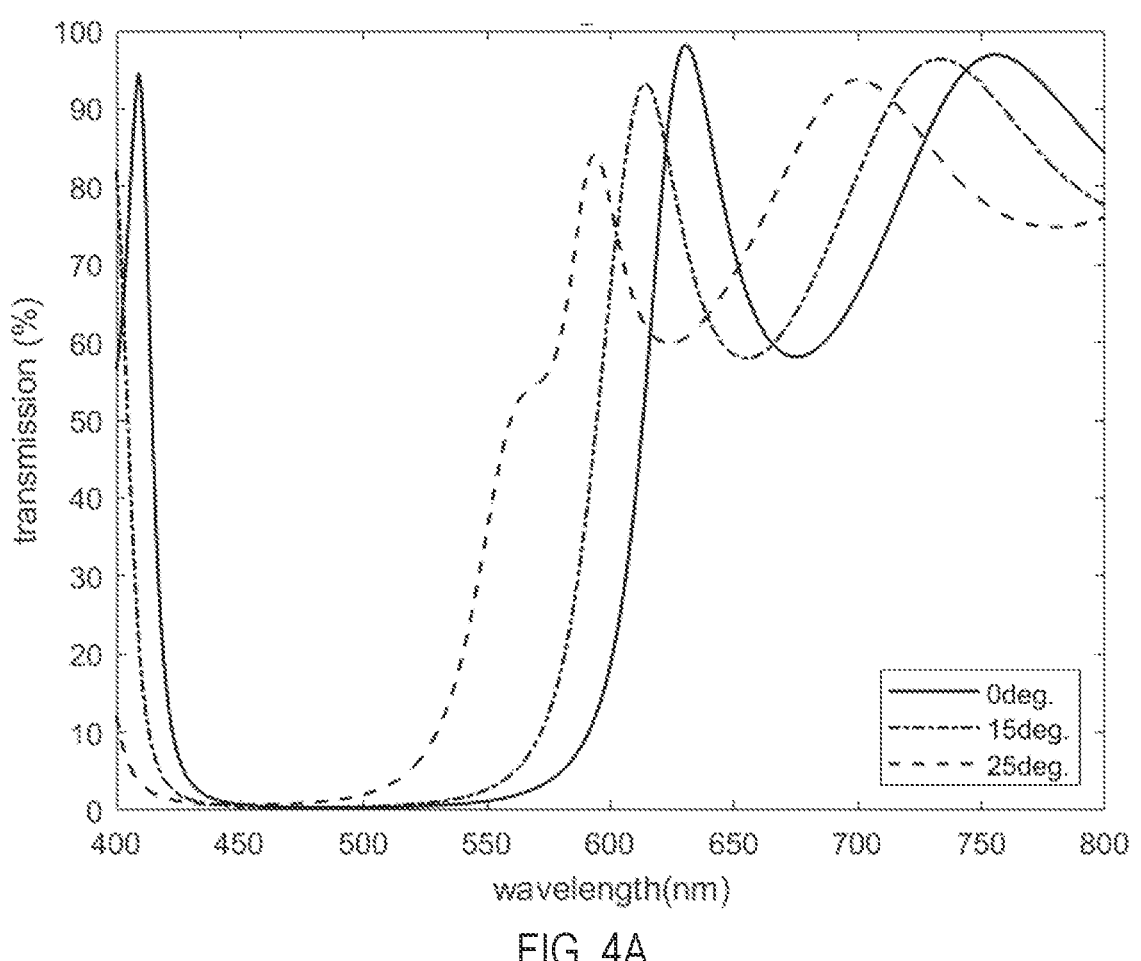
FIG. 4A illustrates transmission characteristics from sapphire to air through an interference filter having multiple $TiO_2$ and $SiO_2$ layers to suppress shorter wavelength emission of an InGaN red LED.

FIG. 3B illustrates a graph of electro-luminescence (EL) intensity versus wavelength for LEDs with a non-filtering ITO/Ag electrode and a filtering ITO/Cu electrode FIG. 4A is a graph that illustrates transmission characteristics from sapphire to air through an interference filter having multiple $TiO_2$ and $SiO_2$ layers to suppress shorter wavelength emission of an InGaN red LED. Filter cut-off shifts to shorter wavelengths as the incident angle increases from 0 to 15 to 25 degrees is illustrated. As will be understood, performance of the filter is relevant only for angles smaller than the critical angle for total internal reflection.

Figure 4B:
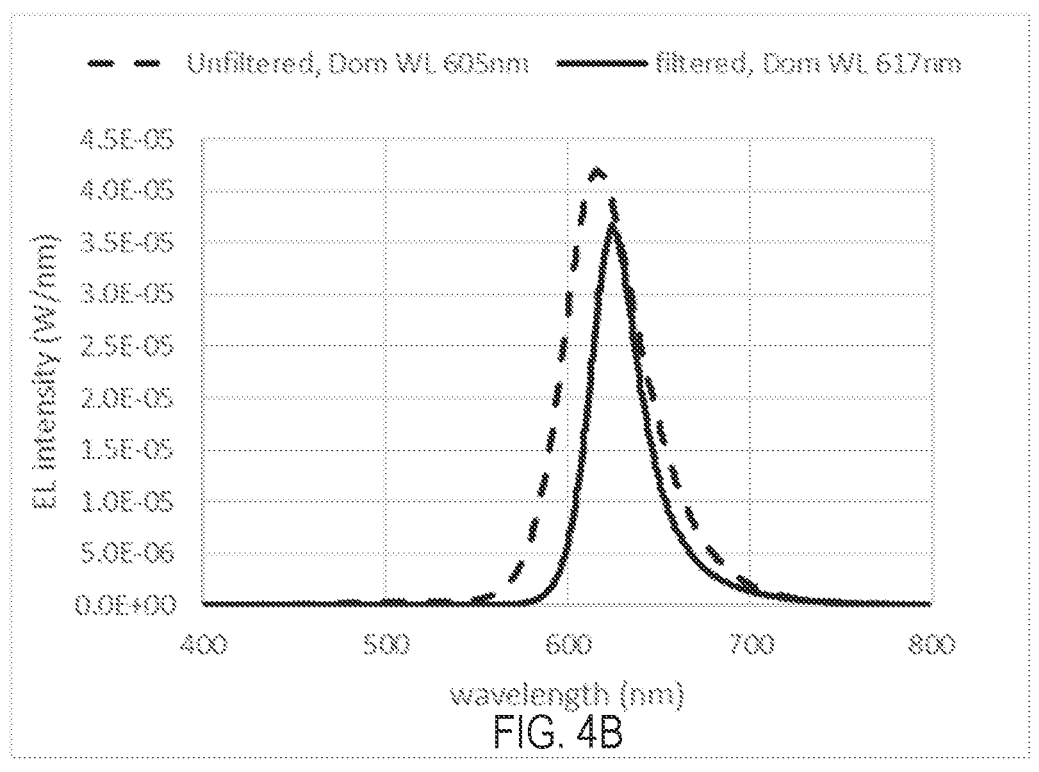
FIG. 4B illustrates a graph of EL intensity versus wavelength for an unfiltered LED and an LED using the filter in FIG. 4A.
Figure 5A:
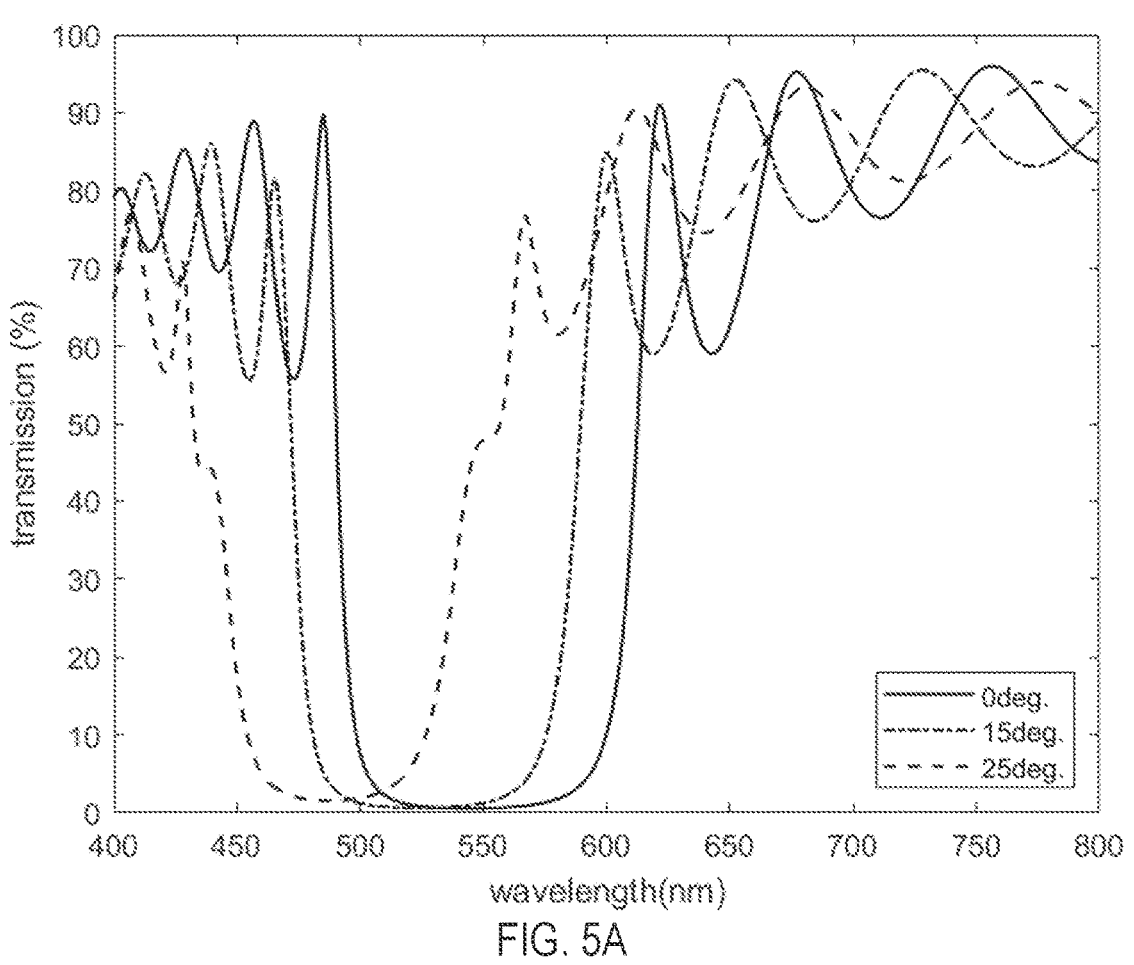
FIG. 5A illustrates transmission characteristics from sapphire to air through an interference filter having multiple $SiN_x$ and $SiO_2$ layers to suppress shorter wavelength emission of an InGaN red LED.

FIG. 4B illustrates a graph of EL intensity versus wavelength for an unfiltered LED and an LED using the filter in FIG. 4A;

FIG. 5A is a graph that illustrates transmission characteristics from sapphire to air through an interference filter having multiple $SiN_x$ and $SiO_2$ layers to suppress shorter wavelength emission of an InGaN red LED. Filter cut-off shifts to shorter wavelengths as the incident angle increases from 0 to 15 to 25 degrees is illustrated. Again, performance of the filter is relevant only for angles smaller than the critical angle for total internal reflection.

Figure 5B:
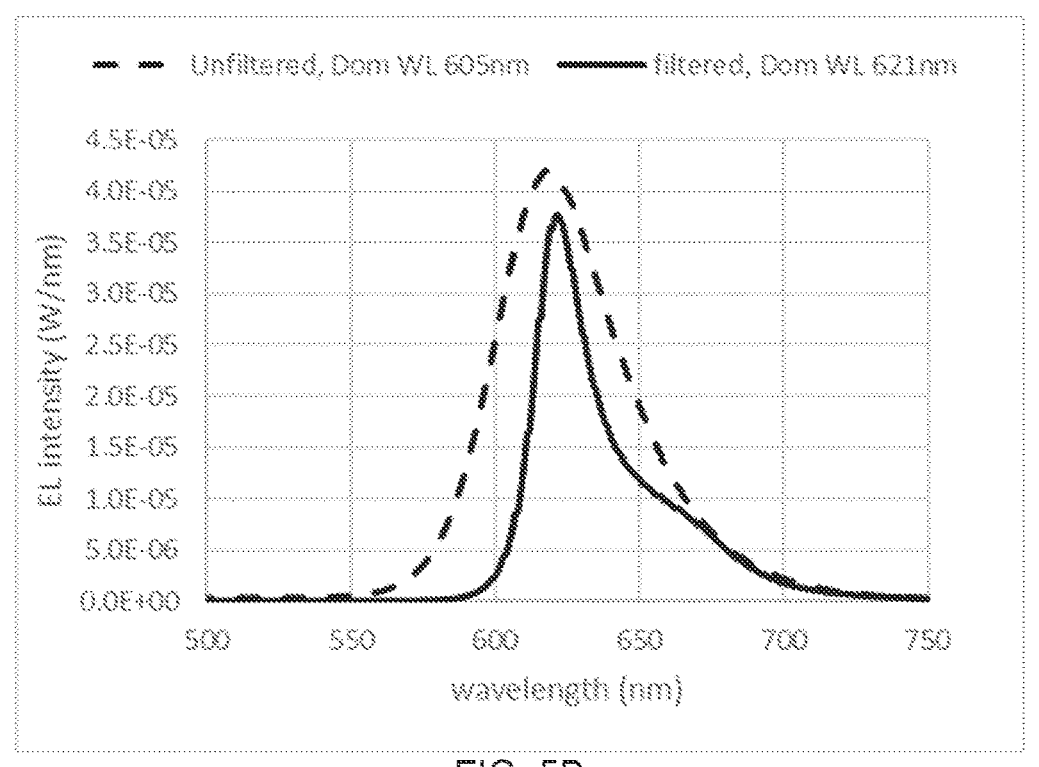
FIG. 5B illustrates a graph of EL intensity versus wavelength for an unfiltered LED and an LED using the filter in FIG. 5A.
Figure 6A:
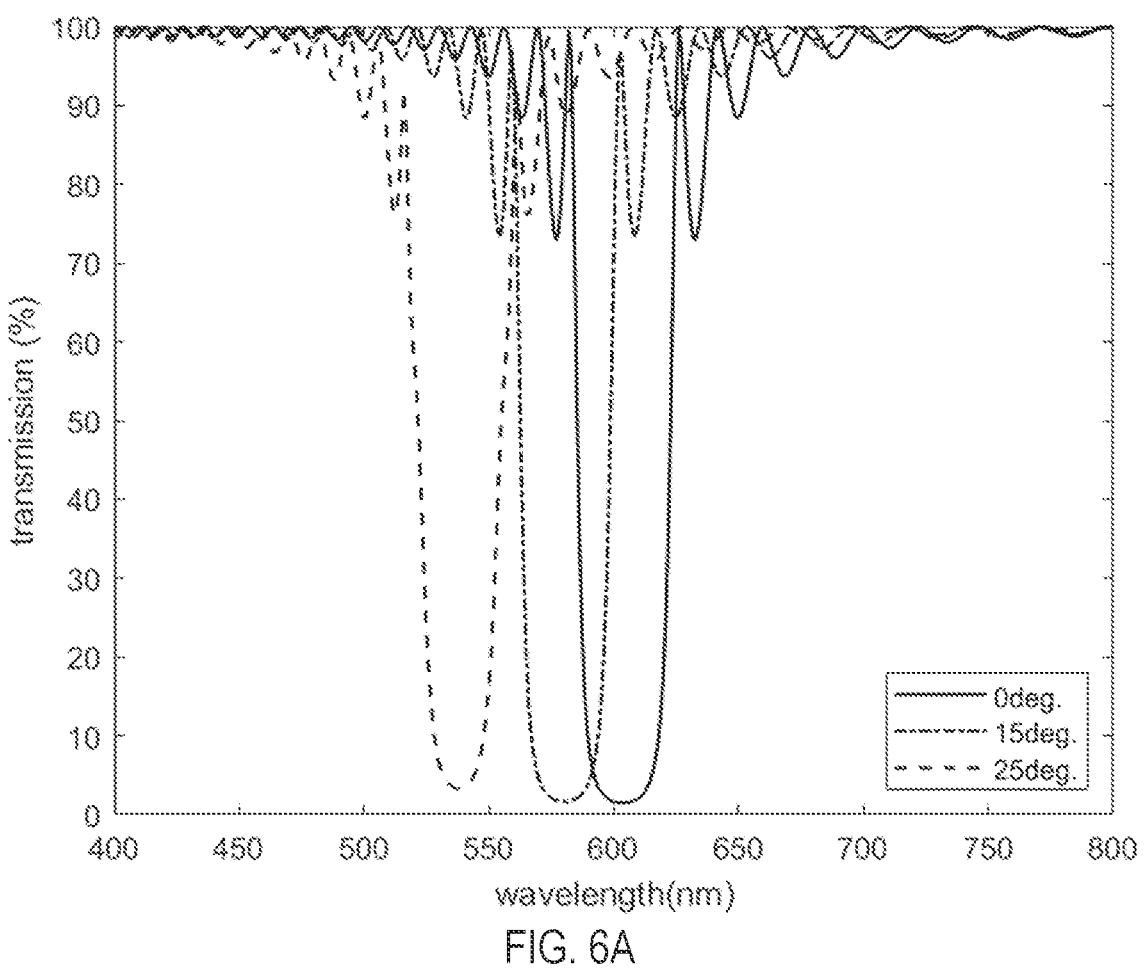
FIG. 6A illustrates transmission characteristics of a filter integrated with LED semiconductor layers.

FIG. 5B illustrates a graph of EL intensity versus wavelength for an unfiltered LED and an LED using the filter in FIG. 5A;

FIG. 6A is a graph that illustrates transmission characteristics of a filter integrated with LED semiconductor layers. The graph 600 shows the blocked band shifting to shorter wavelengths as the angle of incidence increases from 0 to 15 to 25 degrees.

Figure 6B:
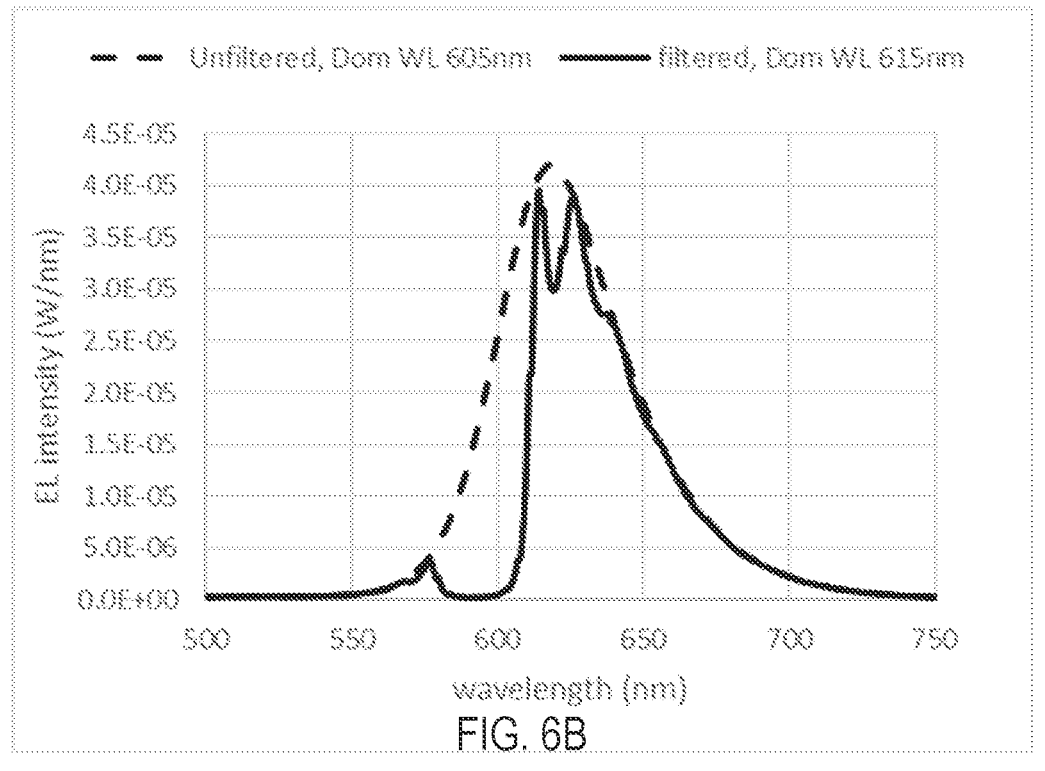
FIG. 6B illustrates a graph of EL intensity versus wavelength for an unfiltered LED and an LED using the filter in FIG. 6A.
Figure 7A:
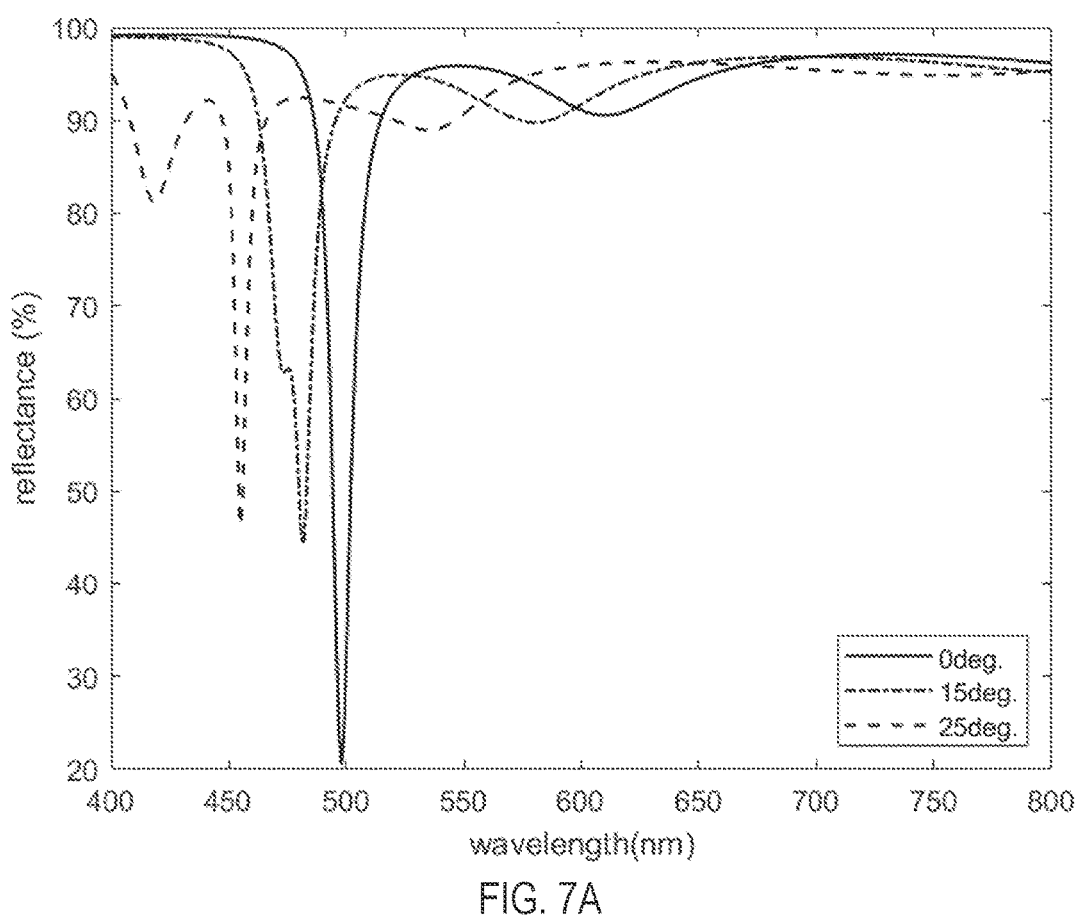
FIG. 7A illustrates reflection characteristics of a composite mirror (ITO/dielectric stack/Ag) designed to filter out the longer part of the emission of a blue LED.

FIG. 6B illustrates a graph of EL intensity versus wavelength for an unfiltered LED and an LED using the filter in FIG. 6A;

FIG. 7A is a graph that illustrates reflection characteristics of a composite mirror (ITO/dielectric stack/Ag) designed to filter out the longer part of the emission of a blue LED. Different angles of incidence (0, 15, and 25 degrees) are indicated. Reflectance near 500 nm is sharply reduced for the range of angles 0-15 degrees and somewhat reduced around 25 degrees.

Figure 7B:
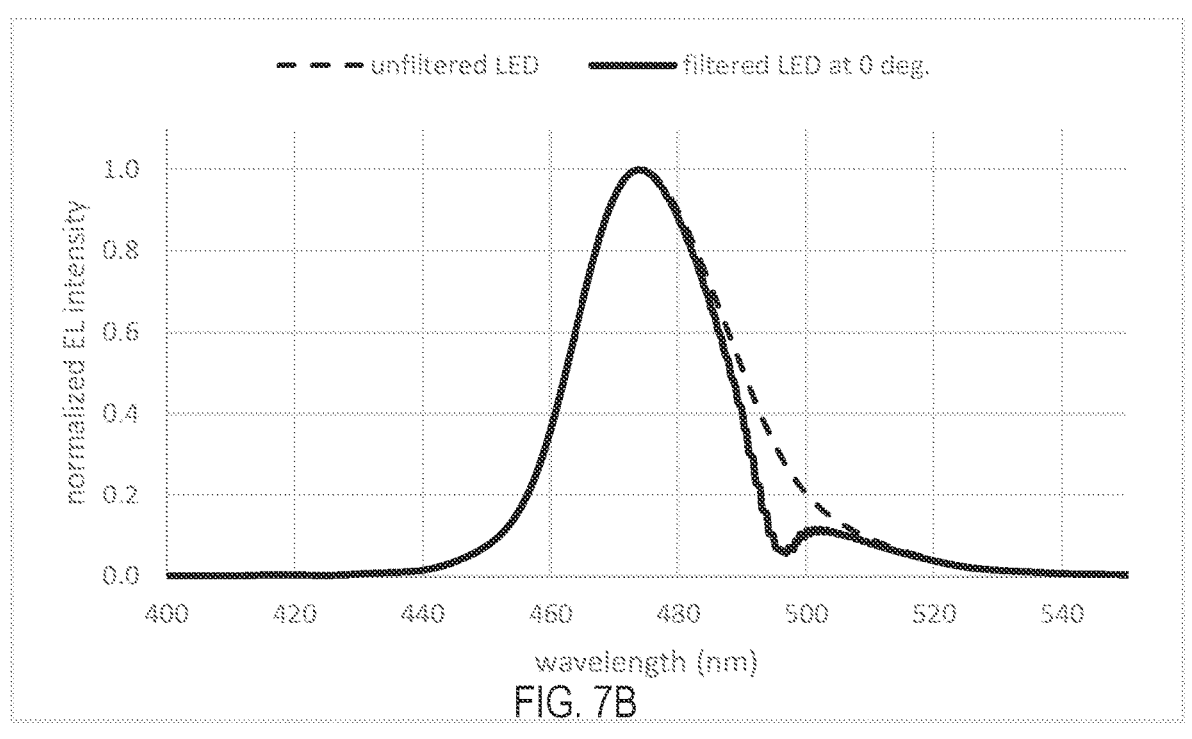
FIG. 7B illustrates a graph of EL intensity versus wavelength for an unfiltered LED and an LED using the filter in FIG. 7A.
Figure 8A:
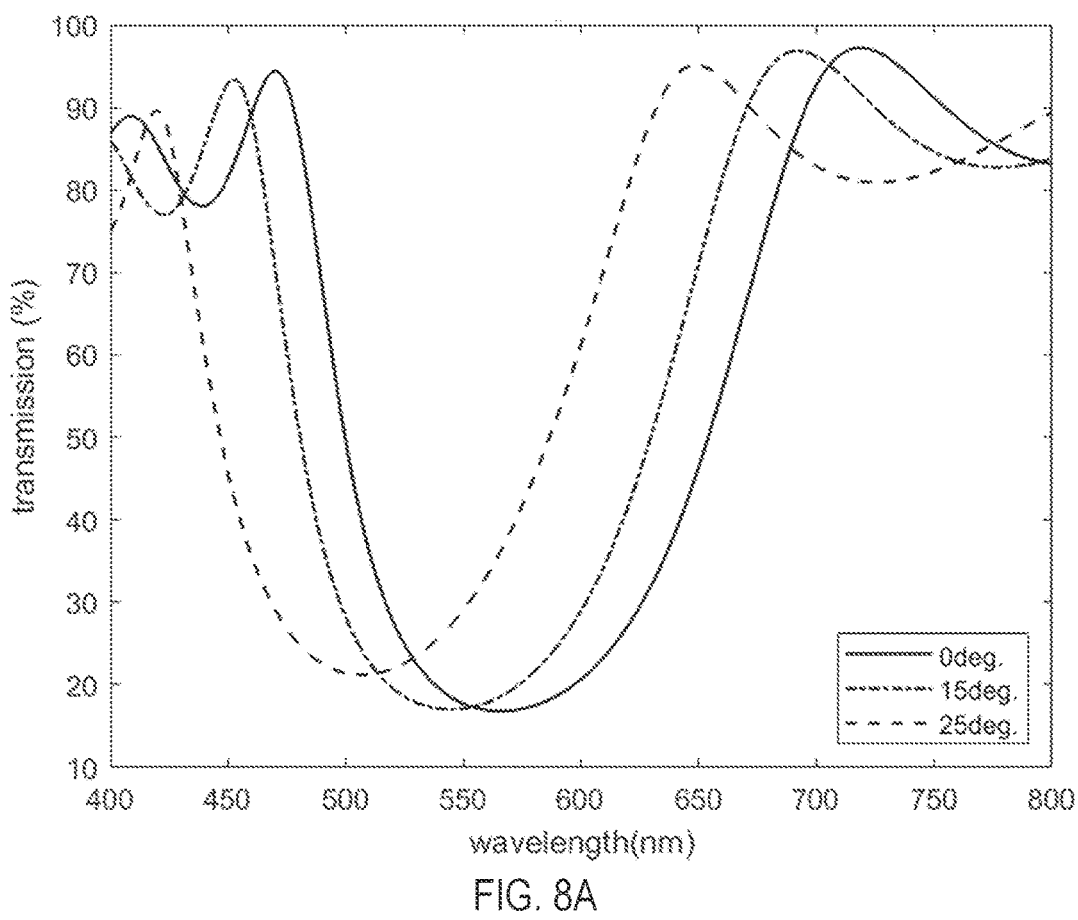
FIG. 8A illustrates transmission characteristics from sapphire to air through an interference filter having multiple $SiN_x$ and $SiO_2$ layers to suppress longer wavelength emission of an InGaN blue LED.

FIG. 7B illustrates a graph of EL intensity versus wavelength for an unfiltered LED and an LED using the filter in FIG. 7A;

FIG. 8A is a graph that illustrates transmission characteristics from sapphire to air through an interference filter having multiple $SiN_x$ and $SiO_2$ layers to suppress longer wavelength emission of an InGaN blue LED. Filter cut-off shifting to shorter wavelengths as the incident angle increases from 0 to 15 to 25 degrees is illustrated. Again, performance of the filter is relevant only for angles smaller than the critical angle for total internal reflection.

Figure 8B:
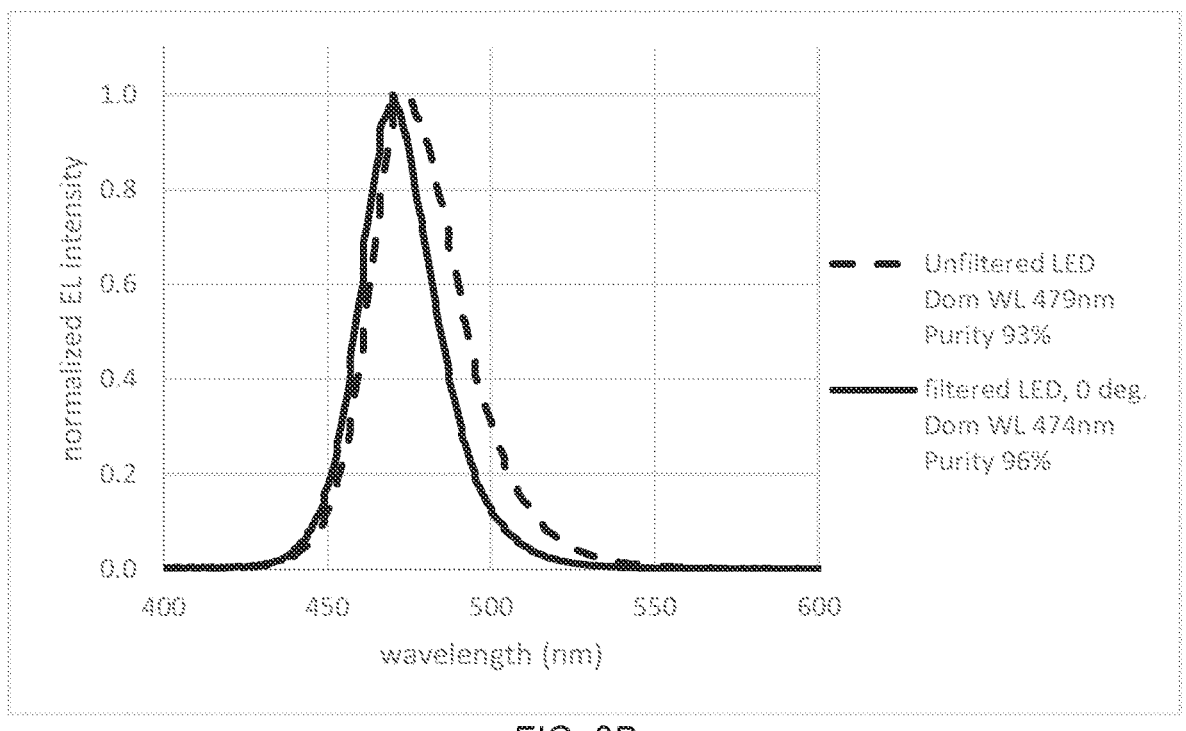
FIG. 8B illustrates a graph of EL intensity versus wavelength for an unfiltered LED and an LED using the filter in FIG. 8A.
Figure 9A:
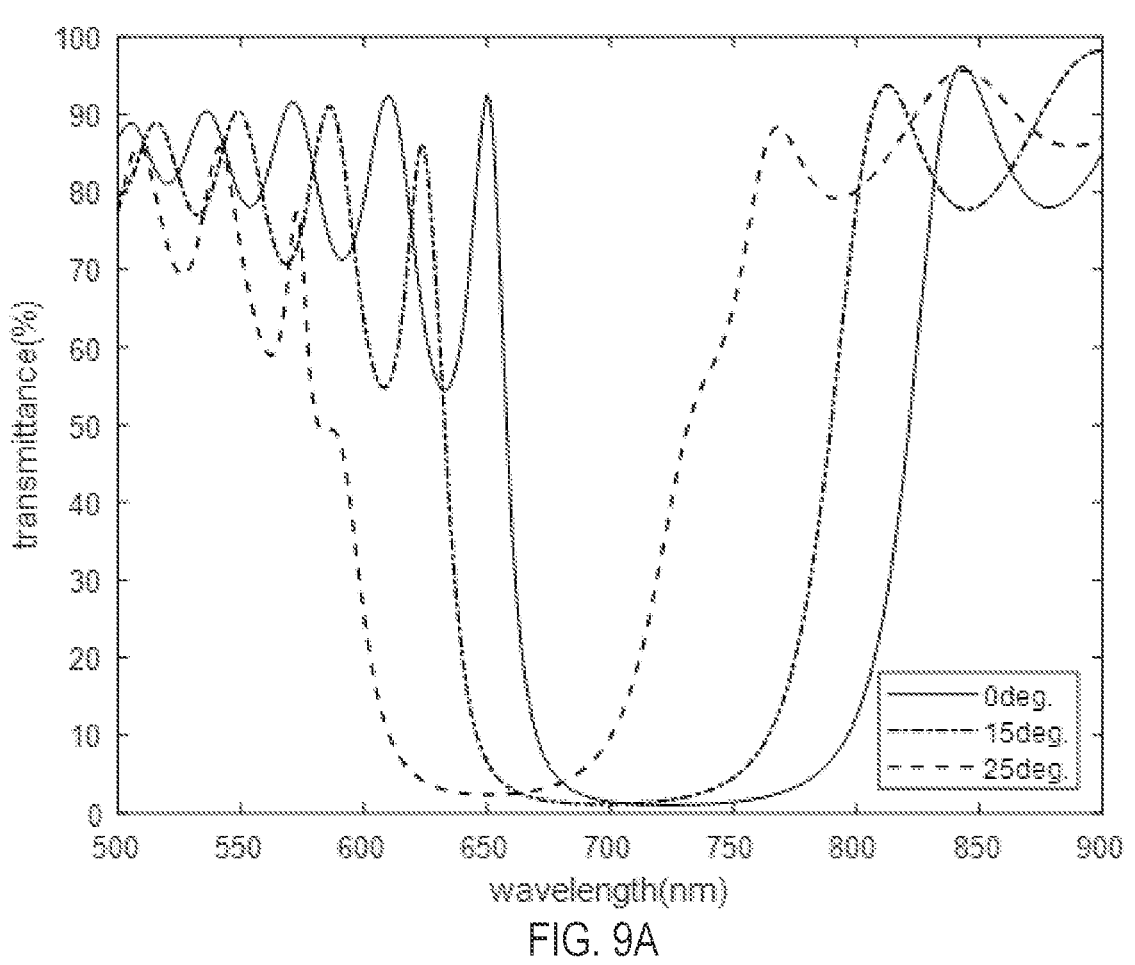
FIG. 9A illustrates sapphire-to-air transmission characteristics for a filter coating used to transmit an infrared part and block a visible part of the emission spectrum of an InGaN LED.

FIG. 8B illustrates a graph of EL intensity versus wavelength for an unfiltered LED and an LED using the filter in FIG. 8A;

FIG. 9A is a graph that illustrates sapphire-to-air transmission characteristics for a filter coating used to transmit an infrared part and block a visible part of the emission spectrum of an InGaN LED. The filter coating on sapphire can include 95 nm SiNx layers, 9 alternating layer pairs of SiO2 and SiNx of respective thickness 126 and 95 nm, and a final layer of SiO2 with thickness 175 nm. In effect, centroid WL can be increased by 10-100 nm for an LED with intrinsic emission spectrum having centroid WL in the range 640-740 nm by filtering out the shorter wavelength part of the emission spectrum. Filter cut-off shifting to shorter wavelengths as the incident angle increases from 0 to 15 to 25 degrees is illustrated. Again, performance of the filter is relevant only for angles smaller than the critical angle for total internal reflection.

Figure 9B:
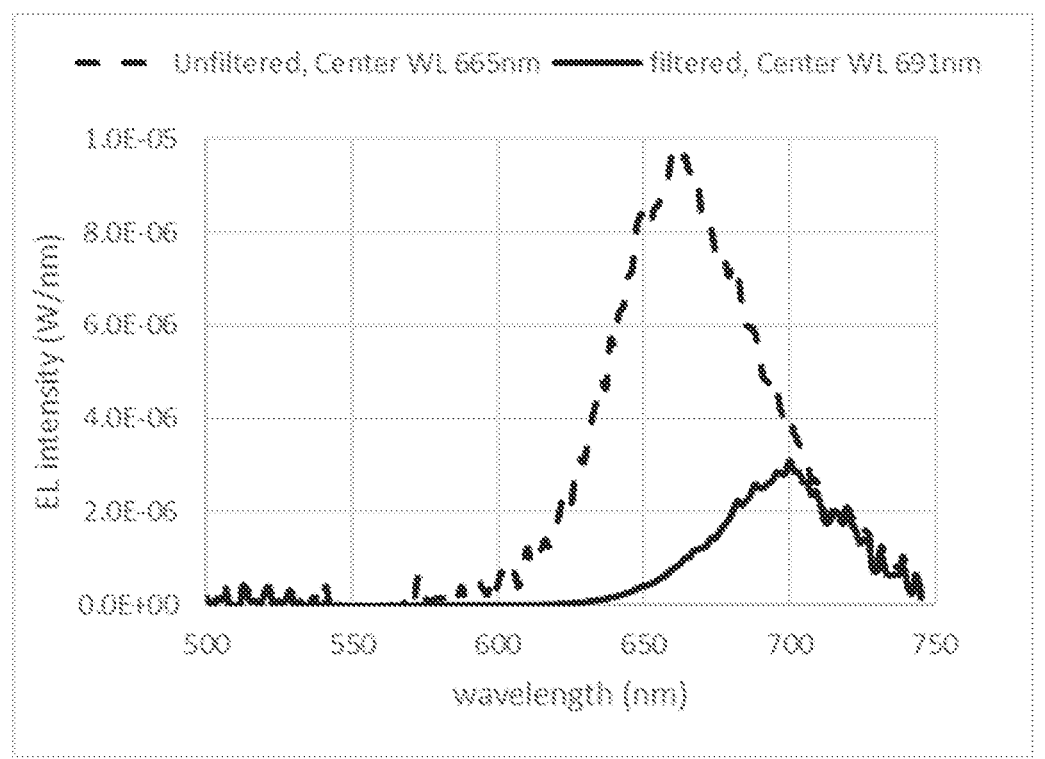
FIG. 9B illustrates a graph of EL intensity versus wavelength for an unfiltered LED and an LED using the filter in FIG. 9A.
Figure 10A:
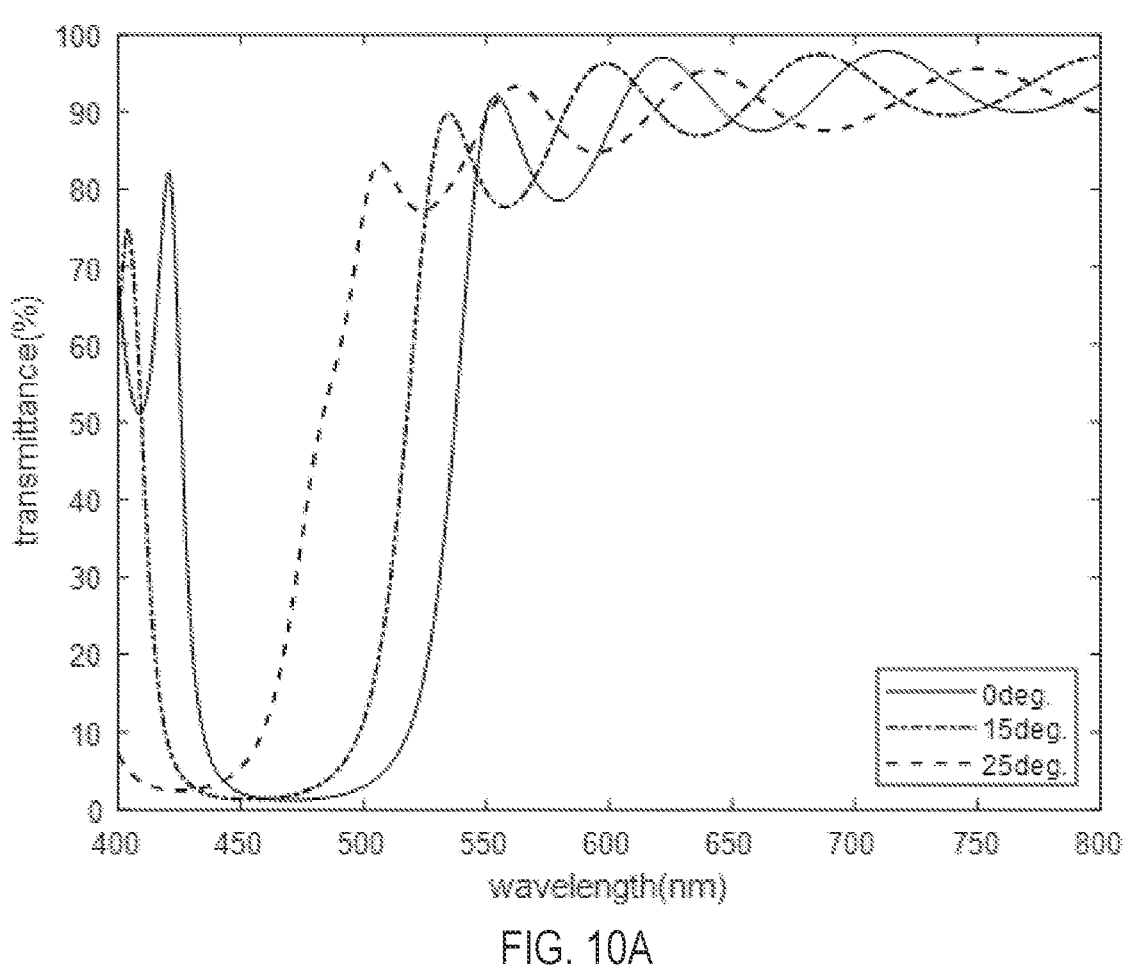
FIG. 10A illustrates sapphire-to-air transmission characteristics for a filter coating used to transmit a green part and block a blue part of the emission spectrum of an InGaN LED.

FIG. 9B illustrates a graph of EL intensity versus wavelength for an unfiltered LED and an LED using the filter in FIG. 9A;

FIG. 10A is a graph that illustrates sapphire-to-air transmission characteristics for a filter coating used to transmit a green part and block a blue part of the emission spectrum of an InGaN LED. The filter coating on sapphire can include 60 nm SiNx layers, 8 alternating layer pairs of SiO2 and SiNx of respective thickness 82 and 60 nm, and a final layer of SiO2 with thickness 115 nm. In effect, color saturation can be increased by at least 3 percentage points by filtering out the shorter wavelength part of the spectrum using this, or other suitable filters positioned over an LED with intrinsic emission spectrum having LDom less than 535 nm and color saturation less than 90%. Filter cut-off shifting to shorter wavelengths as the incident angle increases from 0 to 15 to 25 degrees is illustrated. Again, performance of the filter is relevant only for angles smaller than the critical angle for total internal reflection.

Figure 10B:
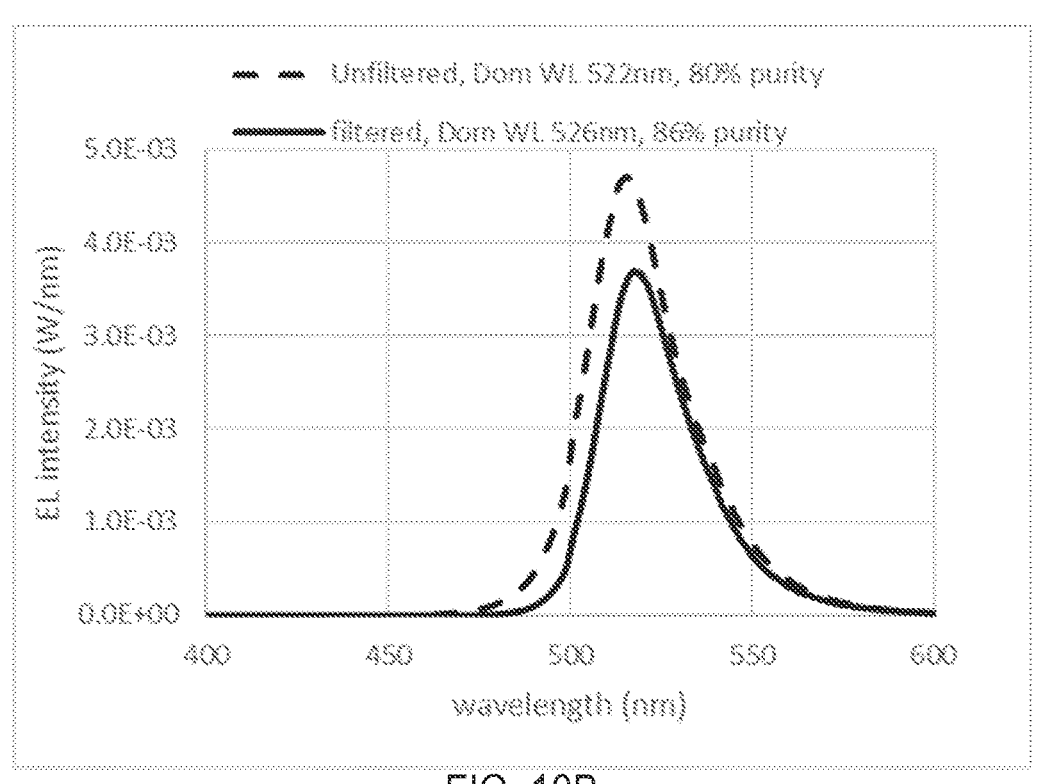
FIG. 10B illustrates a graph of EL intensity versus wavelength for an unfiltered LED and an LED using the filter in FIG. 10A.

FIG. 10B illustrates a graph of EL intensity versus wavelength for an unfiltered LED and an LED using the filter in FIG. 10A.

As will be understood, although the described examples are specific to TFFC LEDs, structures and methods are not limited to TFFC LEDs. An optical absorptive or mirror-based band filter can be coated over any exterior surface of an LED that emits light. The structures and methods are applicable to microLED arrays, microLED displays, RGB displays, or larger LEDs suitable for general lighting, flash lighting, or automotive lighting.

In some embodiments, packaged LEDs or microLEDS can have sidewalls or surrounding regions surrounded by light reflective or absorptive material. Reflective metals or dielectric mirrors can be used, as well as light reflective or absorptive material. Such materials can include organic, inorganic, or organic/inorganic binder and filler material. For example, organic/inorganic binder and filler can be, for example, silicone with embedded reflective titanium oxide (TiO2) or other reflective/scattering particles. Inorganic binders can include sol-gel (e.g., a sol-gel of TEOS or MTMS) or liquid glass (e.g., sodium silicate or potassium silicate), also known as water glass. In some embodiments binders can include fillers that adjust physical properties.

Fillers can include inorganic nanoparticles, silica, glass particles or fibers, or other materials able to improve optical or thermal performance.

The described LEDs can be packaged and optionally include a submount or printed circuit board connected for powering and controlling light production by the semiconductor LED. In certain embodiments, the printed circuit board can also include electrical vias, heat sinks, ground planes, electrical traces, and flip chip or other mounting systems. The submount or printed circuit board may be formed of any suitable material, such as ceramic, silicon, aluminum, etc. If the submount material is conductive, an insulating layer is formed over the substrate material, and the metal electrode pattern is formed over the insulating layer. The submount acts as a mechanical support, provides an electrical interface between electrodes on the LED and a power supply, and provides heat sinking.

In still other embodiments primary or secondary optics can be attached or positioned near packaged LEDs. Optics can include concave or convex lenses, lenslet arrays, graded index lens, reflectors, scattering elements, beam homogenizers, diffusers, or other light focusing or blurring optics. Protective layers, transparent layers, thermal layers, or other packaging structures can be used as needed for specific applications.

Systems and methods for providing absorptive or mirror filters as discussed herein are of particular use for microLED displays. Various emerging display applications, including wearable devices, head-mounted, and large-area displays require miniaturized chips composed of arrays of microLEDs (µLEDs or uLEDs) with a high density having a lateral dimension down to less than 100 µm×100 µm. MicroLEDs (uLEDs) typically have dimensions of about 50 µm in diameter or width and smaller that are used to in the manufacture of color displays by aligning in close proximity microLEDs comprising red, blue and green wavelengths.

In addition to displays, microLED and conventional LEDs with filtering elements can be used to support various beam steering or other applications that benefit from fine-grained intensity, spatial, and temporal control of light distribution. This may include, but is not limited to, precise spatial patterning of emitted light from pixel blocks or individual pixels. Depending on the application, emitted light may be spectrally distinct, adaptive over time, and/or environmentally responsive. The light emitting pixel arrays may provide pre-programmed light distribution in various intensity, spatial, or temporal patterns. Associated optics may be distinct at a pixel, pixel block, or device level. An example light emitting microLED pixel array may include a device having a commonly controlled central block of high intensity pixels with an associated common optic, whereas edge pixels may have individual optics. In addition to flashlights, common applications supported by light emitting pixel arrays include video lighting, automotive headlights, architectural and area illumination, and street lighting.

For example, light emitting matrix pixel arrays may be used to illuminate buildings or areas selectively and adaptively for improved visual display or to reduce lighting costs. In addition, light emitting pixel arrays may be used to project media facades for decorative motion or video effects. In conjunction with tracking sensors and/or cameras, selective illumination of areas around pedestrians may be possible. Spectrally distinct pixels may be used to adjust the color temperature of lighting, as well as support wavelength specific horticultural illumination.

Street lighting is an important application that may greatly benefit from use of light emitting pixel arrays. A single type of light emitting array may be used to mimic various street light types, allowing, for example, switching between a Type I linear streetlight and a Type IV semicircular streetlight by appropriate activation or deactivation of selected pixels. In addition, street lighting costs may be lowered by adjusting light beam intensity or distribution according to environmental conditions, presence or absence of pedestrians as identified by facial recognition, or time of use. For example, light intensity and area of distribution may be reduced when pedestrians are not present. If pixels of the light emitting pixel array are spectrally distinct, the color temperature of the light may be adjusted according to respective daylight, twilight, or night conditions.

Vehicle headlamps are another light emitting array application that requires precise light color control, large pixel numbers, and a high data refresh rate. Automotive headlights that actively illuminate only selected sections of a roadway can used to reduce problems associated with glare or dazzling of oncoming drivers. Using infrared cameras as sensors, light emitting pixel arrays activate only those pixels needed to illuminate the roadway, while deactivating pixels that may dazzle pedestrians or drivers of oncoming vehicles. In some embodiments, off-road pedestrians, animals, or signs may be selectively illuminated to improve driver environmental awareness. If pixels of the light emitting pixel array are spectrally distinct, the color temperature of the light may be adjusted according to respective daylight, twilight, or night conditions.

Embodiments

Various embodiments are listed below. It will be understood that the embodiments listed below may be combined with all aspects and other embodiments in accordance with the scope of the invention.

Embodiment (a). A red LED, comprising: a semiconductor LED layer having an active InGaN layer with intrinsic emission spectrum having $L_{Dom}$ between 580 nm to 620 nm; and a filter positioned over the semiconductor LED layer to filter shorter wavelengths of the intrinsic emission spectrum and shift $L_{Dom}$ by between 5 to 20 nm to a longer wavelength.

Embodiment (b). The LED of embodiment (a), wherein the filter is positioned over the semiconductor layer and at least one of directly integrated, positioned in contact, or positioned on an intermediate transparent layer with respect to the semiconductor LED layer.

Embodiments (c). The LED of embodiments (a) to (b), further comprising a transparent conductive layer attached to the semiconductor LED layer, and wherein the filter is attached to the transparent conductive layer.

Embodiment (d). The LED of embodiments (a) to (c), further comprising a transparent sapphire layer attached to the semiconductor LED layer on a first side, and wherein the filter is attached to the transparent sapphire layer on a second side.

Embodiment (e). The LED of embodiments (a) to (d), wherein the filter includes absorptive material.

Embodiments (f). The LED of embodiments (a) to (e), wherein the filter includes II-VI semiconductors.

Embodiment (g). The LED of embodiments (a) to (f), wherein the filter includes at least one metallic material.

Embodiment (h). The LED of embodiments (a) to (g), wherein the filter includes a wavelength selective mirror.

Embodiment (i). The LED of embodiments (a) to (h), wherein the LED is a microLED.

Embodiment (j). The LED of embodiments (a) to (i), wherein the LED forms a part of an RGB display.

Embodiment (k). A blue LED, comprising: a semiconductor LED layer having an active InGaN layer that emits an intrinsic spectrum with dominant wavelength greater than 470 nm and color saturation less than 93%; and a filter positioned over the semiconductor LED layer to filter out longer wavelengths of the emitted intrinsic spectrum and increase color saturation by at least 3 percentage points.

Embodiment (l). The LED of embodiment (k), wherein the filter is positioned over the semiconductor layer and at least one of directly integrated, positioned in contact, or positioned on an intermediate transparent layer with respect to the semiconductor LED layer.

Embodiments (m). The LED of embodiments (k) to (l), further comprising a transparent conductive layer attached to the semiconductor LED layer, and wherein the filter is attached to the transparent conductive layer.

Embodiment (n). The LED of embodiments (k) to (m), further comprising a transparent sapphire layer attached to the semiconductor LED layer on a first side, and wherein the filter is attached to the transparent sapphire layer on a second side.

Embodiment (o). The LED of embodiments (k) to (n), wherein the filter includes absorptive material.

Embodiments (p). The LED of embodiments (k) to (o), wherein the filter includes II-VI semiconductors.

Embodiment (q). The LED of embodiments (k) to (p), wherein the filter includes at least one metallic material.

Embodiment (r). The LED of embodiments (k) to (q), wherein the filter includes a wavelength selective mirror.

Embodiment (s). The LED of embodiments (k) to (rh), wherein the LED is a microLED.

Embodiment (t). The LED of embodiments (k) to (s), wherein the LED forms a part of an RGB display.

Embodiment (u). An infrared LED, comprising: a semiconductor LED layer having an active InGaN layer that emits an intrinsic spectrum with centroid WL in a range 640-740 nm; and a filter positioned over the semiconductor LED layer to filter out a shorter wavelength part of the emitted intrinsic spectrum and increase centroid WL by 10-100 nm.

Embodiment (v). The LED of embodiment (u), wherein the filter is positioned over the semiconductor layer and at least one of directly integrated, positioned in contact, or positioned on an intermediate transparent layer with respect to the semiconductor LED layer.

Embodiments (w). The LED of embodiments (u) to (v), further comprising a transparent conductive layer attached to the semiconductor LED layer, and wherein the filter is attached to the transparent conductive layer.

Embodiment (x). The LED of embodiments (u) to (w), further comprising a transparent sapphire layer attached to the semiconductor LED layer on a first side, and wherein the filter is attached to the transparent sapphire layer on a second side.

Embodiment (y). The LED of embodiments (u) to (x), wherein the filter includes absorptive material.

Embodiments (z). The LED of embodiments (u) to (y), wherein the filter includes II-VI semiconductors.

Embodiment (aa). The LED of embodiments (u) to (z), wherein the filter includes at least one metallic material.

Embodiment (bb). The LED of embodiments (u) to (aa), wherein the filter includes a wavelength selective mirror.

Embodiment (cc). The LED of embodiments (u) to (bb), wherein the LED is a microLED.

Embodiment (dd). The LED of embodiments (u) to (cc), wherein the LED forms a part of an RGB display.

Embodiment (ee). A green LED, comprising: a semiconductor LED layer having an active InGaN layer that emits an intrinsic spectrum with dominant wavelength less than 535 nm and color saturation less than 90%; and a filter positioned over the semiconductor LED layer to filter out shorter wavelengths of the emitted intrinsic spectrum and increase color saturation by at least 3 percentage points.

Embodiment (ff). The LED of embodiment (ee), wherein the filter is positioned over the semiconductor layer and at least one of directly integrated, positioned in contact, or positioned on an intermediate transparent layer with respect to the semiconductor LED layer.

Embodiments (gg). The LED of embodiments (ee) to (ff), further comprising a transparent conductive layer attached to the semiconductor LED layer, and wherein the filter is attached to the transparent conductive layer.

Embodiment (hh). The LED of embodiments (ee) to (gg), further comprising a transparent sapphire layer attached to the semiconductor LED layer on a first side, and wherein the filter is attached to the transparent sapphire layer on a second side.

Embodiment (ii). The LED of embodiments (ee) to (hh), wherein the filter includes absorptive material.

Embodiments (jj). The LED of embodiments (ee) to (ii), wherein the filter includes II-VI semiconductors.

Embodiment (kk). The LED of embodiments (ee) to (jj), wherein the filter includes at least one metallic material.

Embodiment (ll). The LED of embodiments (ee) to (kk), wherein the filter includes a wavelength selective mirror.

Embodiment (mm). The LED of embodiments (ee) to (ll), wherein the LED is a microLED.

Embodiment (nn). The LED of embodiment (a), embodiment (k), embodiment (u), or embodiment (ee), wherein the filter is positioned over the semiconductor layer and at least one of directly integrated, positioned in contact, or positioned on an intermediate transparent layer with respect to the semiconductor LED layer.

Embodiments (oo). The LED of embodiment (a), embodiment (k), embodiment (u), or embodiment (ee), further comprising a transparent conductive layer attached to the semiconductor LED layer, and wherein the filter is attached to the transparent conductive layer.

Embodiment (pp). The LED of embodiment (a), embodiment (k), embodiment (u), or embodiment (ee), further comprising a transparent sapphire layer attached to the semiconductor LED layer on a first side, and wherein the filter is attached to the transparent sapphire layer on a second side.

Embodiment (qq). The LED of embodiment (a), embodiment (k), embodiment (u), or embodiment (ee), wherein the filter includes absorptive material.

Embodiments (rr). The LED of embodiment (a), embodiment (k), embodiment (u), or embodiment (ee), wherein the filter includes II-VI semiconductors.

Embodiment (ss). The LED of embodiment (a), embodiment (k), embodiment (u), or embodiment (ee), wherein the filter includes at least one metallic material.

Embodiment (tt). The LED of embodiment (a), embodiment (k), embodiment (u), or embodiment (ee), wherein the filter includes a wavelength selective mirror.

Embodiment (uu). The LED of embodiment (a), embodiment (k), embodiment (u), or embodiment (ee), wherein the LED is a microLED.

Embodiment (vv). The LED of embodiment (a), embodiment (k), or embodiment (u), wherein the LED forms a part of an RGB display.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

What is claimed is:

1. A red LED, comprising:
a semiconductor LED layer having an active InGaN layer with an emission spectrum having a peak wavelength in a range of from 580 nm to 620 nm; and
a filter positioned over the semiconductor LED layer, the filter including one or more of an absorptive material, a polycrystalline II-VI semiconductor alloy, at least one metallic material, or a wavelength selective mirror, and the filter configured to filter shorter wavelengths of the emission spectrum of the active InGaN layer and shift the peak wavelength by between 5 nm to 20 nm to a longer wavelength.

2. The LED of claim 1, further comprising a transparent conductive layer attached or a transparent sapphire layer disposed between the semiconductor LED layer and the filter.

3. The LED of claim 1, wherein the red LED is a microLED.

4. The LED of claim 1, wherein the red LED forms a part of an RGB display.

5. The LED of claim 1, wherein the polycrystalline II-VI semiconductor alloy comprises one or more of cadmium (Cd), selenium (Se), sulfur(S), zinc (Zn), or tellurium (Te).

6. The LED of claim 1, wherein the polycrystalline II-VI semiconductor alloy has a thickness in a range of from 200 nm to 2000 nm.

7. The LED of claim 1, wherein the at least one reflective metallic material comprises one or more of Au, Au—Cu alloys, TIN, HIN, ZrN, Ni, or CrN.

8. The LED of claim 1, wherein the wavelength selective mirror comprises one or more of $SiN_x$, $TiO_2$, $SiO_2$, or aluminum indium nitride (AlInN), or aluminum indium gallium nitride (AlInGaN).

* * * * *